US012732201B2

(12) United States Patent
Kao et al.

(10) Patent No.: US 12,732,201 B2
(45) Date of Patent: Sep. 8, 2026

(54) SUCCESSIVE-APPROXIMATION REGISTER ANALOG-TO-DIGITAL CONVERTER WITH COMPARATOR ERROR DETECTION

(71) Applicant: MEDIATEK INC., Hsinchu City (TW)

(72) Inventors: Tsung-Kai Kao, San Jose, CA (US); Chi-Lun Lo, San Jose, CA (US)

(73) Assignee: MEDIATEK INC., Hsinchu City (TW)

( * ) Notice: Subject to any disclaimer, the term of this patent is extended or adjusted under 35 U.S.C. 154(b) by 147 days.

(21) Appl. No.: 18/739,623

(22) Filed: Jun. 11, 2024

(65) Prior Publication Data

US 2024/0413830 A1 Dec. 12, 2024

Related U.S. Application Data

(60) Provisional application No. 63/507,486, filed on Jun. 12, 2023.

(51) Int. Cl.
*H03M 1/06* (2006.01)

(52) U.S. Cl.
CPC ................................ *H03M 1/0604* (2013.01)

(58) Field of Classification Search
CPC ...... H03M 1/468; H03M 1/462; H03M 1/466; H03M 1/12; H03M 1/1009; H03M 1/1245; H03M 1/42; H03M 1/804; H03M 1/06; H03M 1/0607; H03M 1/1023; H03M 1/1215; H03M 1/38; H03M 1/00; H03M 1/002; H03M 1/0604; H03M 1/0678; H03M 1/0682; H03M 1/0854; H03M 1/1033; H03M 1/164; H03M 1/365; H03M 1/40; H03M 1/001; H03M 1/0612; H03M 1/0617; H03M 1/0626; H03M 1/0692;
(Continued)

(56) References Cited

U.S. PATENT DOCUMENTS 5,691,722 A * 11/1997 Wang ..................... H03M 1/42 341/161
6,281,831 B1 * 8/2001 Shou ..................... H03M 1/42 341/172

(Continued)

OTHER PUBLICATIONS

Lee, J., et al.; "A 0.56mW 63.6dB SNDR 250MS/s SAR ADC in 8nmFinFET;" 2022 IEEE Symposium on VLSI Technology and Circuits; Jun. 2022; pp. 90-91.

(Continued)

*Primary Examiner* — Linh V Nguyen
(74) *Attorney, Agent, or Firm* — McClure, Qualey & Rodack, LLP

(57) ABSTRACT

A successive-approximation register analog-to-digital converter (SAR ADC) with comparator error detection is shown, which introduces a comparator error detector to detect errors of the comparators used in the SAR ADC. Digital control bits controlling a digital-to-analog converter (DAC) of the SAR ADC include most significant bits (MSBs) and least significant bits (LSBs), and the DAC is configured to provide redundancy approximation at the lowest bit of the MSBs. The comparators include a plurality of MSB comparators corresponding to the MSBs. The comparator error detector detects the occurrence of a comparator error based on the LSBs, and identifies the target comparator that is causing the comparator error based on the MSBs.

15 Claims, 5 Drawing Sheets

(58) Field of Classification Search
CPC ............. H03M 1/0695; H03M 1/0818; H03M 1/1014; H03M 1/1019; H03M 1/1047; H03M 1/1057; H03M 1/125; H03M 1/1295; H03M 1/144; H03M 1/34; H03M 1/361; H03M 1/368; H03M 1/403; H03M 1/44; H03M 1/445; H03M 3/426; H03M 9/00
USPC ................. 341/118–120, 155, 161, 162, 172
See application file for complete search history.

(56) References Cited

U.S. PATENT DOCUMENTS 9,166,608 B1* 10/2015 Deguchi ............. H03M 1/1071
9,369,140 B1* 6/2016 Sundaresan ......... G01S 7/52025
9,559,716 B1* 1/2017 Matsui ................ H03M 1/1061
9,819,314 B1* 11/2017 Chiu ................... H03F 3/45188
9,843,337 B1* 12/2017 Li ....................... H03M 1/1009
2012/0001781 A1* 1/2012 Scanlan .............. H03M 1/1004 341/110
2013/0201043 A1* 8/2013 Wong .................... H03M 1/125 341/122
2013/0214951 A1* 8/2013 Ho ........................ H03M 3/458 341/143
2013/0285844 A1* 10/2013 Lin ......................... H03M 1/12 341/110
2016/0126967 A1* 5/2016 Oh .......................... H03M 1/66 341/118
2023/0208427 A1* 6/2023 Fulde .................... H03M 1/002 341/155
2023/0275593 A1* 8/2023 Bunsen ............... H03M 1/1061 341/118
2023/0336184 A1* 10/2023 Huang ................ H03M 1/0692

OTHER PUBLICATIONS

Jull, L., et al.; "A 10b 1.5GS/s Pipelined-SAR ADC withBackground Second-Stage Common-Mode Regulation and Offset Calibration in 14nmCMOS FinFET;" ISSCC 2017 / Session 28 / Hybrid ADCS / 28.5; Feb. 2017; pp. 473-476.

* cited by examiner

SUCCESSIVE-APPROXIMATION REGISTER ANALOG-TO-DIGITAL CONVERTER WITH COMPARATOR ERROR DETECTION

CROSS REFERENCE TO RELATED APPLICATIONS

This application claims the benefit of U.S. Provisional Application No. 63/507,486, filed Jun. 12, 2023, the entirety of which is incorporated by reference herein.

BACKGROUND OF THE INVENTION

Field of the Invention

The disclosure relates to successive-approximation register analog-to-digital converters (SAR ADCs), and in particular, it relates to comparator error detection for SAR ADC.

Description of the Related Art

Successive-approximation register analog-to-digital converters (SAR ADCs) are widely used in electronic circuits. A SAR ADC uses a binary or non-binary search through all possible quantization levels for successive approximation of a digital representation of an analog input. The successive approximation proceeds through iterated comparison operations in one approximation cycle. ADC accuracy depends on the reliability of the comparison operations. How to detect the comparator error for further compensation operations to improve the accuracy of ADC output is an important topic in this field.

BRIEF SUMMARY OF THE INVENTION

A successive-approximation register analog-to-digital converter (SAR ADC) with comparator error detection is shown.

A SAR ADC in accordance with an exemplary embodiment of the disclosure includes a digital-to-analog converter, a plurality of comparators, and a successive-approximation register (SAR) logic, which are configured to form a loop for successive approximation of a digital representation of an analog input. Especially, the SAR ADC includes a comparator error detector coupled to the loop. Digital control bits controlling the digital-to-analog converter include most significant bits and least significant bits. The digital-to-analog converter is configured to provide redundancy approximation at the lowest bit of the most significant bits. The comparators include a plurality of most-significant-bit (MSB) comparators corresponding to the most significant bits. The comparator error detector detects the occurrence of a comparator error based on the least significant bits, and identifies the target comparator that is causing the comparator error based on the most significant bits.

In an exemplary embodiment, the MSB comparators correspond to the most significant bits in a one-to-one relationship, and generate the most significant bits one by one. In an exemplary embodiment, each MSB comparator is reset just one time in one approximation cycle.

In an exemplary embodiment, the comparator error detector is coupled to the SAR logic to receive the least significant bits, and transforms the least significant bits into least significant bit (LSB) code that corresponds to a normal range. When determining that the LSB code is beyond the normal range, the comparator error detector confirms the occurrence of a comparator error (especially an MSB comparator error).

When determining that the LSB code is greater than the upper boundary of the normal range, the comparator error detector determines that the target comparator introduces a negative offset. In an exemplary embodiment, the lowest bit of the most significant bits is the $M_{th}$ bit of the digital control bits, where M is a number. K is a number greater than M. When determining that the $K_{th}$ bit of the digital control bits is 0 and the $(K-1)_{th}$ bit to the $M_{th}$ bit of the digital control bits are all Is, the comparator error detector determines that a $K_{th}$ MSB comparator corresponding to the $K_{th}$ bit of the digital control bits is the target comparator with the negative offset.

In an exemplary embodiment, it is determined whether the $(M+1)_{th}$ bit and the Mtn bit of the digital control bits (i.e. the least significant two bits of [BN, B(N−1), . . . , BM]) is "10" when an overshoot LSB code occurs. If yes, the comparator error detector determines that the $M_{th}$ most-significant-bit comparator CompHM corresponding to the $M_{th}$ bit (BM) of the digital control bits is the target comparator with the negative offset.

When determining that the LSB code is smaller than the lower boundary of the normal range, the comparator error detector determines that the target comparator introduces a positive offset. In an exemplary embodiment, the lowest bit of the most significant bits is the $M_{th}$ bit of the digital control bits, where M is a number. K is a number greater than M. When determining that the $K_{th}$ bit of the digital control bits is 1 and the $(K-1)_{th}$ bit to the $M_{th}$ bit of the digital control bits are all 0s, the comparator error detector determines that a $K_{th}$ MSB comparator corresponding to the $K_{th}$ bit of the digital control bits is the target comparator with the positive offset.

In an exemplary embodiment, it is determined whether the $(M+1)_{th}$ bit and the $M_{th}$ bit of the digital control bits (i.e. the least significant two bits of [BN, B(N−1), . . . , BM]) is "01" when a undershoot LSB code occurs. If yes, the comparator error detector determines that the $M_{th}$ most-significant-bit comparator CompHM corresponding to the $M_{th}$ bit (BM) of the digital control bits is the target comparator with the positive offset.

In an exemplary embodiment, the comparator error detector determines an offset value of the target comparator based on a difference between the LSB code and the upper boundary or the lower boundary of the normal range.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description lists various embodiments of the present disclosure, but is not intended to limit thereto. The actual scope of the disclosure should be defined according to the scope of the application. The various logics, units, modules, or functional blocks mentioned below may be implemented by a combination of hardware, software, and/or firmware, and may also include special circuits. The various logics, units, modules, or functional blocks are not limited to being implemented separately, but may also be combined together to share certain functions.

Figure 1:
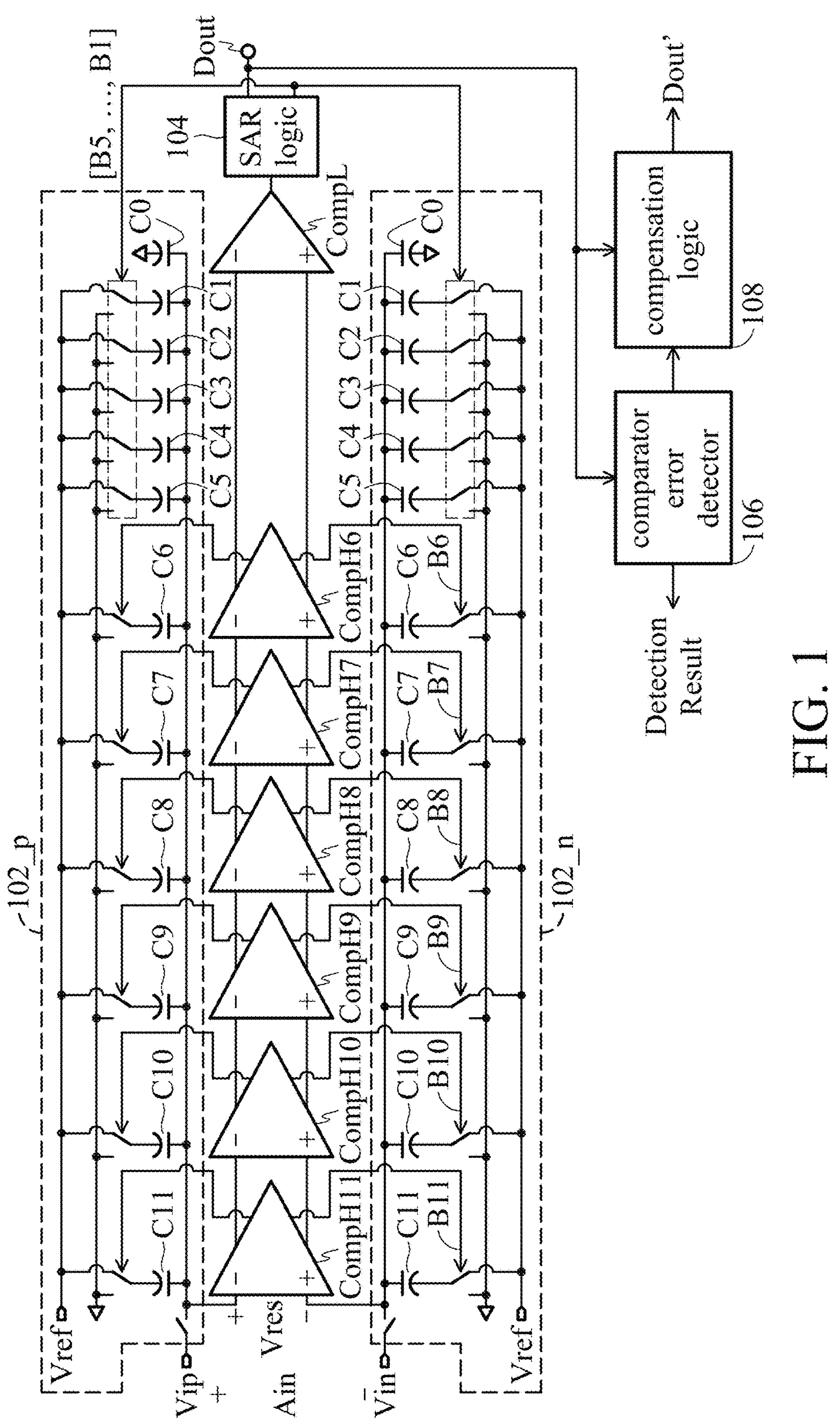
FIG. 1 depicts a successive-approximation register analog-to-digital converter (SAR ADC) 100 in accordance with an exemplary embodiment of the disclosure.

FIG. 1 depicts a successive-approximation register analog-to-digital converter (SAR ADC) 100 in accordance with an exemplary embodiment of the disclosure.

The SAR ADC 100 includes a digital-to-analog converter (DAC, including a positive DAC part 102_*p* and a negative DAC part 102_*n* for the differential architecture of the SAR ADC 100), a plurality of comparators (including CompH11~CompH6 and CompL), a successive-approximation register logic (SAR logic) 104, a comparator error detector 106, and a compensation logic 108.

In this example, the DAC (102_*p* and 102_*n*) is a capacitor DAC (CDAC), which form a loop with the comparators (CompH11~CompH6 and CompL) and the SAR logic 104, for successive approximation of a digital representation Dout of an analog input Ain. As shown, the analog input Ain is entered in a differential form, wherein Ain=Vip−Vin. The positive differential input Vip is sampled by the positive DAC part 102_*p*, while the negative differential input Vin is sampled by the negative DAC part 102_*n*. The comparators (CompH6~CompH11 and CompL) are operated to check a residue voltage Vres between the capacitor top plate of the positive DAC part 102_*p* and the capacitor top plate of the negative DAC part 102_*n*. According to the comparison results, digital control bits [B11, B10, . . . , B1 from the higher bit to the lower bit (e.g., from MSB to LSB) are generated gradually, to individually control the connection of the capacitors C11, C10, . . . , C1 (to couple to a reference voltage Vref or a ground terminal) to reduce the residue voltage Vres. Based on the generated digital control bits [B11, B10, . . . , B1] (which are represented from MSB to LSB), the SAR logic 104 outputs the digital representation Dout of the analog input Ain.

The comparator error detector 106 is coupled to the loop to detect the comparator errors. The compensation logic 108 is coupled to the SAR logic 104 and the comparator error detector 106 to adjust the digital representation Dout to compensate for the comparator errors. The adjusted result is Dout'.

In this exemplary embodiment, the DAC (including 102_*p* and 102_*n*) is especially configured to provide redundancy approximation at the $6^{th}$ bit B6 of the digital control bits [B11, B10, . . . , B1]. Through the redundancy approximation, comparison errors in the higher bits (B11~B7) may be corrected.

Figure 2A:
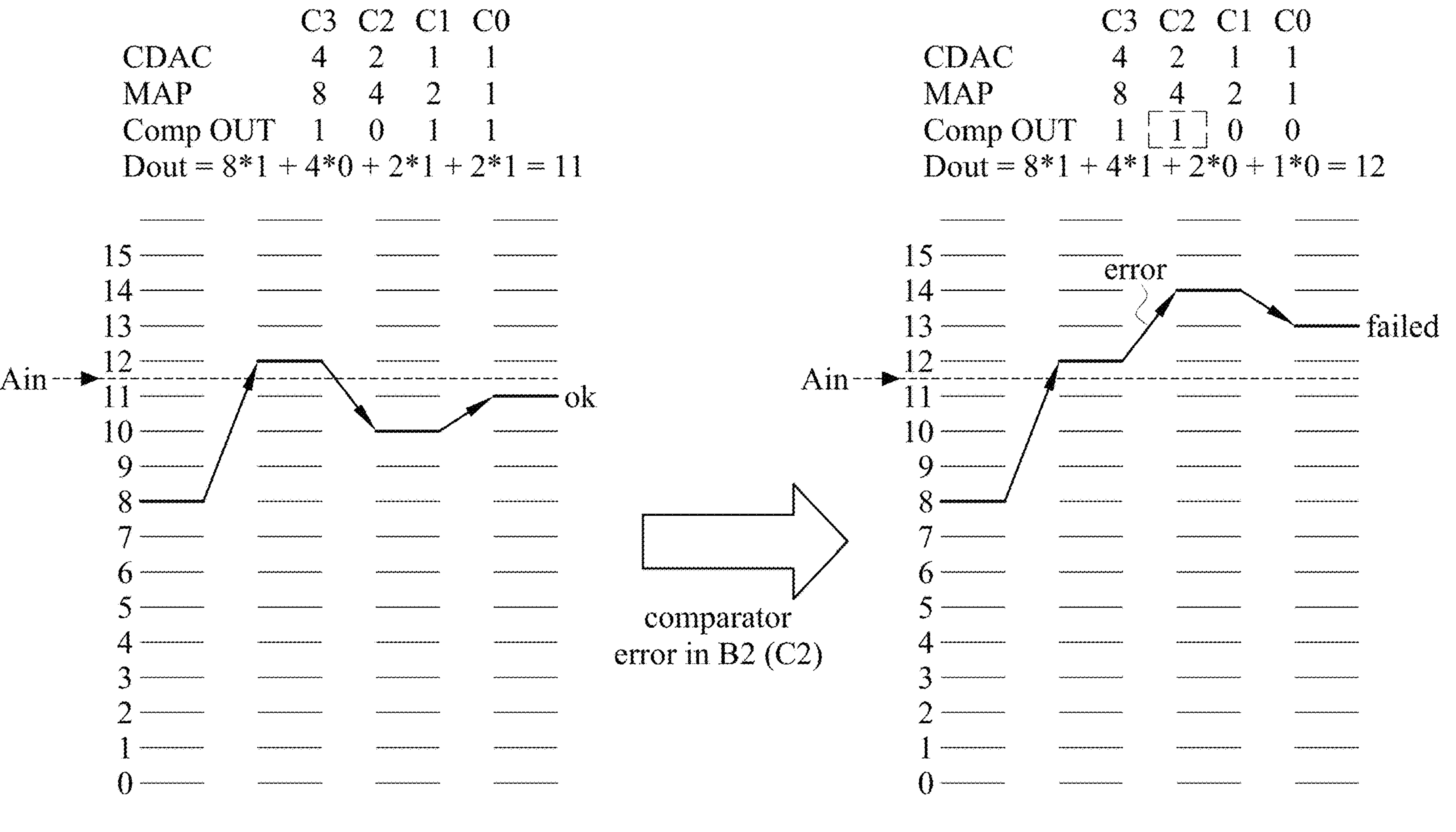
FIG. 2A and FIG. 2B show examples to describe the benefits of redundancy approximation.
Figure 2B:
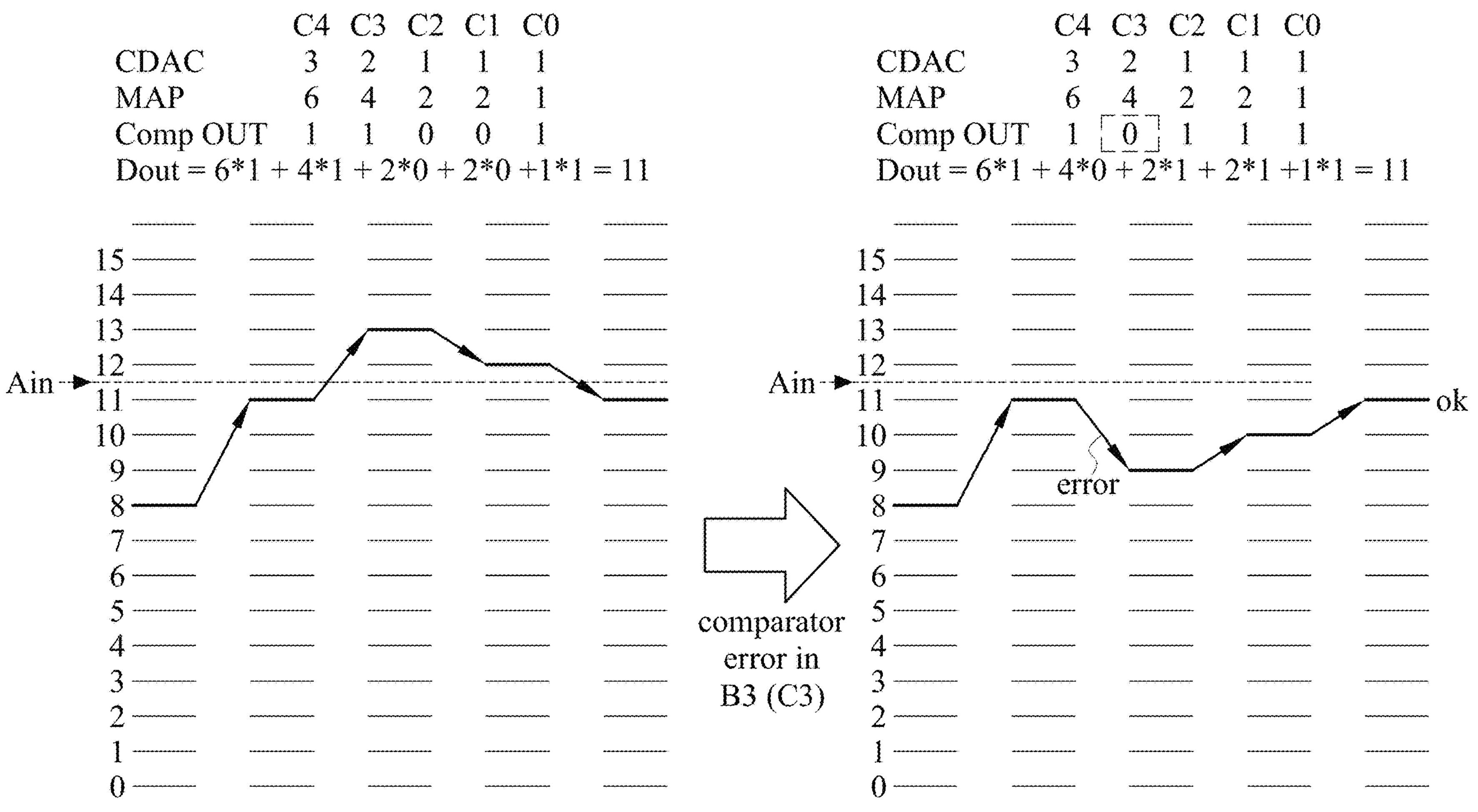

To implement such a redundancy approximation design, the capacitance ratio between the capacitors of the CDAC is planned in a special way. FIG. 2A and FIG. 2B show examples to describe the benefits of redundancy approximation.

FIG. 2A shows that a SAR ADC without redundancy approximation may fail in the analog-to-digital conversion. In this example, the size of the connection switchable capacitors C1, C2, and C3 increase in a normal factor 2. No redundancy approximation is introduced. The right picture shows that the wrong comparison output that controls the connection of the capacitor C2 results in a divergence of the analog-to-digital conversion.

FIG. 2B shows that a SAR ADC with redundancy approximation can successfully complete the analog-to-digital conversion. The capacitor C3 of FIG. 2A is divide into two capacitors C4 and C2 of FIG. 2B and, accordingly, redundancy approximation is introduced. The right picture shows that the wrong comparison output that controls the connection of the capacitor C3 is corrected by the redundancy approximation performed by the connection control of the capacitor C2, which results in a convergence of the analog-to-digital conversion. Such a redundancy approximation concept is used in the disclosure.

Referring back to FIG. 1, the number 0 capacitor C0 is fixed to the ground terminal. The first capacitor C1 corresponding to the lowest bit B1 of the digital control bits [B11, B10, . . . , B1] is the same size as the number 0 capacitor C0. The digital control bits [B5, B4, . . . , B1] controlling the capacitors (C5, C4, . . . , C1) are named least significant bits. From the first capacitor C1 to the $5^{th}$ capacitor C5 corresponding to the lowest bit B1 to the highest bit B5 of the least significant bits [B5, B4, . . . , B1], the capacitor size increases by a factor of two. The digital control bits [B11, B10, . . . , B6] controlling the capacitors (C11, C10, . . . , C6) are named most significant bits. The $6^{th}$ capacitor C6 corresponding to the lowest bit B6 of the most significant bits [B11, B10, . . . , B6] is the same size as the $5^{th}$ capacitor C5 corresponding to the highest bit B5 of the least significant bits [B5, B4, . . . , B1]. Thus, redundancy approximation is performed by the connection control of the $6^{th}$ capacitor C6. In this example, from the $6^{th}$ capacitor C6 to the $11^{th}$ capacitor C11 corresponding to the lowest bit B6 to the highest bit B11 of the most significant bits [B11, B10, . . . , B6], the capacitor size is still increased by a factor of two. Table 1 shows the capacitance design.

TABLE 1

| | MSB | | | | | | LSB | | | | | |
|---|---|---|---|---|---|---|---|---|---|---|---|---|
| Cap. No. | 11 | 10 | 9 | 8 | 7 | 6 | 5 | 4 | 3 | 2 | 1 | 0 |
| Cap. Size | 512 | 256 | 128 | 64 | 32 | 16 | 16 | 8 | 4 | 2 | 1 | 1 |
| Cap. sum | 1040 | 528 | 272 | 144 | 80 | 48 | 32 | 16 | 8 | 4 | 2 | 1 |
| Benefit of redundancy (LSB) | 16 | 16 | 16 | 16 | 16 | 16 | 0 | 0 | 0 | 0 | 0 | 0 |
| Benefit of redundancy (%) | 3% | 6% | 13% | 25% | 50% | 100% | 0% | 0% | 0% | 0% | 0% | 0% |

In this example, the error correction capability is 16 LSB. The comparator errors happened at the higher bits B7~B11 can be corrected by the 16 LSB.

Note that in the disclosure the capacitors C11, C10, . . . , C6 controlled by the most significant bits [B11, B10, . . . , B6] are paired with a plurality of most-significant-bit (MSB) comparators CompH11, CompH10, . . . , CompH6 in a one-to-one relationship. The MSB comparators CompH11, CompH10, . . . , CompH6 generate the most significant bits [B11, B10, . . . , B6] one by one. In this manner, each of the MSB comparators CompH11~CompH6 is reset just one time in one approximation cycle. It is a high speed design. In the conventional design, the shared comparator is repeatedly reset in one approximation cycle to generate a series of digital control bits for converting Ain to Dout, which is very slow.

Different from the generation of the most significant bits [B11, B10, . . . , B6], the least significant bits [B5, B4, . . . , B1] controlling the connection of the capacitors C5, C4, . . . , C1 are generated by the shared least-significant-bit (LSB) comparator CompL. The LSB comparator CompL is repeatedly reset in one approximation cycle. However, in some other exemplary embodiments, more comparators may be used to generate the least significant bits [B5, B4, . . . , B1]. It is not intended to limit the number of LSB comparators.

Figure 3:
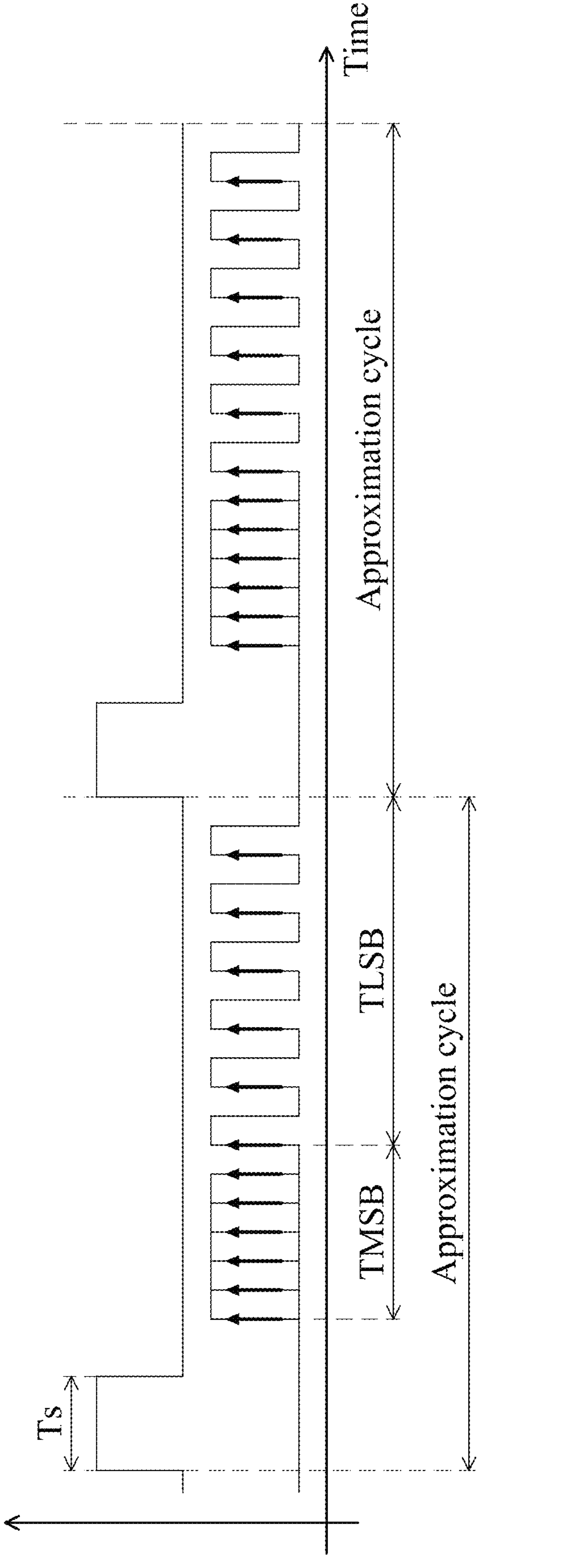
FIG. 3 shows clock cycles for analog-to-digital conversion.

FIG. 3 shows clock cycles for analog-to-digital conversion. Each approximation cycle for converting Ain to Dout includes a sampling period Ts, an MSB comparison period TMSB, and an LSB comparison period TLSB. Because the multiple MSB comparators CompH11~CompH6 operate one by one without being delayed by reset operations, the MSB comparison period TMSB generating the most significant bits [B11, B10, . . . , B6] is much shorter than the LSB comparison period TLSB generating the least significant bits [B5, B4, . . . , B1].

The comparator error detector 106 is detailed in the following paragraphs.

The comparator error detector 106 may detect occurrence of a comparator error based on the least significant bits [B5, B4, . . . , B1], and identifies the target comparator that is causing the comparator error based on the most significant bits [B11, B10, . . . , B6].

The comparator error detector 106 is coupled to the SAR logic 104 to receive the least significant bits [B5, B4, . . . , B1], and transforms the least significant bits [B5, B4, . . . , B1] into a least-significant-bit (LSB) code that corresponds to a normal range. According to the capacitance design of Table 1, the normal range of the LSB code is 16~47 (i.e., $2^{(6-2)}$~$2^{(6-1)}+2^{(6-2)}-1$). When determining that the LSB code is beyond the normal range (16~47), the comparator error detector 106 confirms the occurrence of a comparator error.

When determining that the LSB code is greater than an upper boundary (47) of the normal range (16~47), the comparator error detector 106 determines that the target comparator introduces a negative offset. When determining that one of the most significant bits [B11, B10, . . . , B6] is 0 and followed by all 1s in the lower bits of the most significant bits [B11, B10, . . . , B6], the bit value 0 indicates the target comparator with the negative offset. For example, when [B11, B10, . . . , B6] is 011111, it means that the comparator CompH11 relates to the negative offset. When [B11, B10, . . . , B6] is X01111, it means that the comparator CompH10 relates to the negative offset. When [B11, B10, . . . , B6] is XX0111, it means that the comparator CompH9 relates to the negative offset. When [B11, B10, . . . , B6] is XXX011, it means that the comparator CompH8 relates to the negative offset. When [B11, B10, . . . , B6] is XXXX01, it means that the comparator CompH7 relates to the negative offset.

Note that the error of the comparator CompH6 is determined in another way. Corresponding to the overshoot LSB code situation (greater than 47), it is determined whether [B11, B10, . . . , B6] is XXXX10 (e.g., B7 is 1 and B6 is 0). If yes, it means that the comparator CompH6 relates to the negative offset.

When determining that the LSB code is lower than the lower boundary (16) of the normal range (16~47), the comparator error detector 106 determines that the target comparator introduces a positive offset. When determining that one of the most significant bits [B11, B10, . . . , B6] is 1 and followed by all 0s in the lower bits of the most significant bits [B11, B10, . . . , B6], the bit value 1 indicates the target comparator with the positive offset. For example, when [B11, B10, . . . , B6] is 100000, it means that the comparator CompH11 relates to the positive offset. When [B11, B10, . . . , B6] is X10000, it means that the comparator CompH10 relates to the positive offset. When [B11, B10, . . . , B6] is XX1000, it means that the comparator CompH9 relates to the positive offset. When [B11, B10, . . . , B6] is XXX100, it means that the comparator CompH8 relates to the positive offset. When [B11, B10, . . . , B6] is XXXX10, it means that the comparator CompH7 relates to the positive offset.

Note that the error of the comparator CompH6 is determined in another way. Corresponding to the undershoot LSB code situation (lower than 16), it is determined whether [B11, B10, . . . , B6] is XXXX01 (e.g., B7 is 0 and B6 is 1). If yes, it means that the comparator CompH6 relates to the positive offset.

Figure 4:
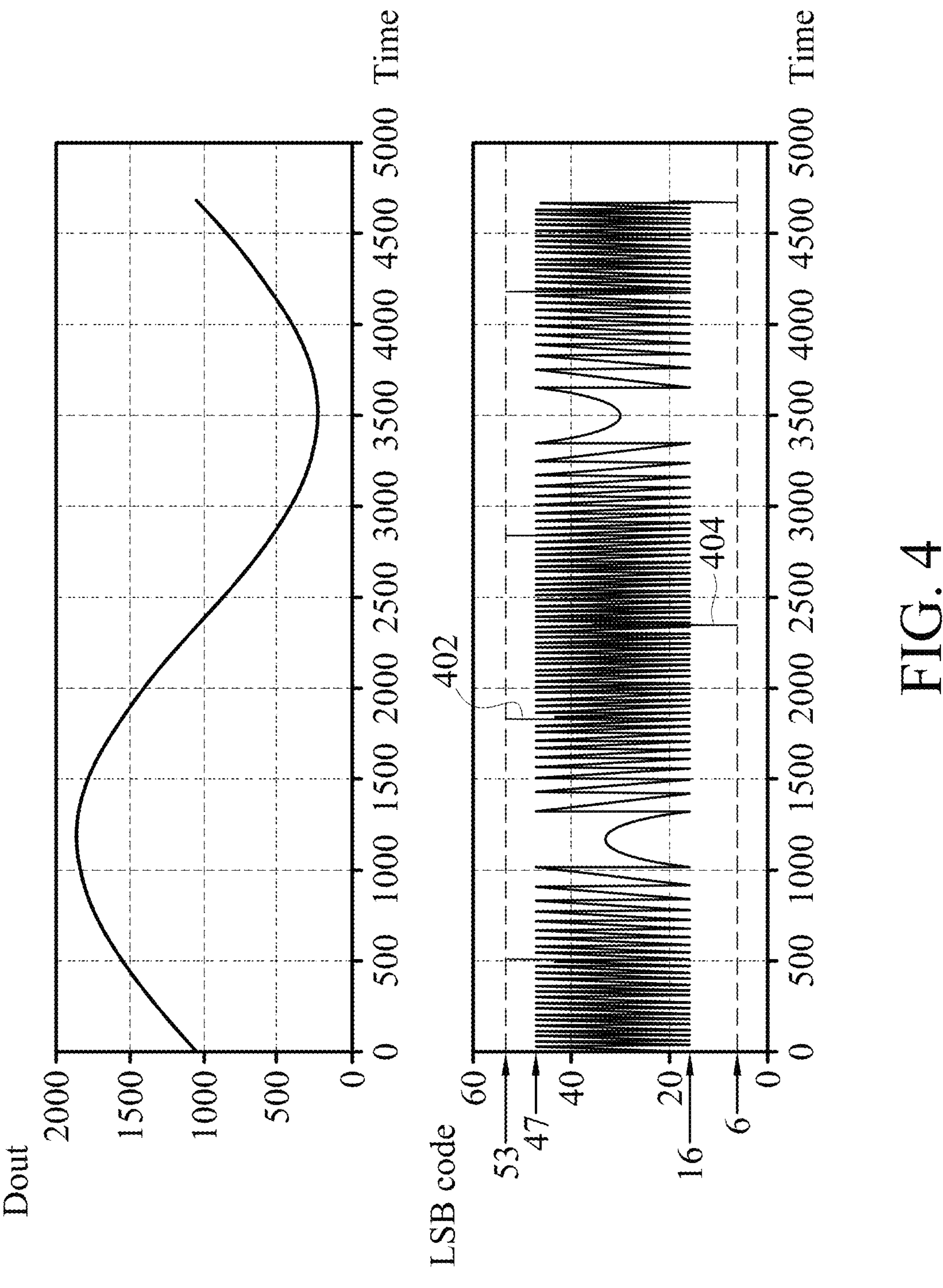
FIG. 4 illustrates waveforms of Dout and the LSB code in accordance with an exemplary embodiment of the disclosure.

FIG. 4 illustrates waveforms of Dout and the LSB code in accordance with an exemplary embodiment of the disclosure.

As indicated by 402, a negative comparator offset is presented by the LSB code greater than the upper limit 47. The comparator error detector 106 detecting the overshoot 402 further checks the most significant bits [B11, B10, . . . , B6] and obtains that it is x011111. Thus, the comparator error detector 106 determines that the target comparator with the detected negative offset is the MSB comparator CompH10.

As indicated by 404, a positive comparator offset is presented by the LSB code lower than the lower limit 16. The comparator error detector 106 detecting the undershoot 404 further checks the most significant bits [B11, B10, . . . , B6], and obtains that it is 100000. Thus, the comparator error detector 106 determines that the target comparator with the detected positive offset is the MSB comparator CompH11.

The comparator error detector 106 may further determine an offset value of the target comparator based on a difference between the LSB code and the upper boundary (47) or the lower boundary (16) of the normal range (16~47). The compensation logic 108 is coupled to the SAR logic 104 and the comparator error detector 106 to adjust the digital representation Dout to compensate for the offset value of the target comparator that is obtained by the comparator error detector 106. Accordingly, the adjusted result Dout' is generated.

Referring back to FIG. 4, the negative offset indicated by 402 is −6 LSB (53−47). The comparator error detector 106 detects the −6 LSB offset carried by the MSB comparator CompH10 and, accordingly, operates the compensation logic 108 to modify Dout to Dout' to compensate for the '6 LSB offset of the MSB comparator CompH10.

FIG. 4 further shows that the negative offset indicated by 404 is +10 LSB (16−6). The comparator error detector 106 detects the +10 LSB offset carried by the MSB comparator CompH11 and, accordingly, operates the compensation logic 108 to modify Dout to Dout' to compensate for the +10 LSB offset of the MSB comparator CompH11.

The redundancy approximation may be introduced via another capacitor, such as the seventh capacitor C7. Table 2 shows the related capacitance design.

TABLE 2

| | MSB | | | | | LSB | | | | | | |
|---|---|---|---|---|---|---|---|---|---|---|---|---|
| Cap. No. | 11 | 10 | 9 | 8 | 7 | 6 | 5 | 4 | 3 | 2 | 1 | 0 |
| Cap. Size | 512 | 256 | 128 | 64 | 32 | 32 | 16 | 8 | 4 | 2 | 1 | 1 |
| Cap. sum | 1056 | 544 | 288 | 160 | 96 | 64 | 32 | 16 | 8 | 4 | 2 | 1 |
| Benefit of redundancy (LSB) | 32 | 32 | 32 | 32 | 32 | 0 | 0 | 0 | 0 | 0 | 0 | 0 |
| Benefit of redundancy (%) | 6% | 13% | 25% | 50% | 100% | 0% | 0% | 0% | 0% | 0% | 0% | 0% |

In this example, the redundancy approximation introduced by the capacitor C7 may provide an error correction capability of 32 LSB. The comparator errors happened at the higher bits B11, B10, . . . , B8 may be corrected by the 32 LSB.

In an exemplary embodiment, N is a number, M is a number lower than N, and the redundancy approximation is introduced via the $M_{th}$ capacitor corresponding to the lowest bit BM of the most significant bits [BN, B(N−1), . . . , BM]. The $M_{th}$ capacitor is the same size as the $(M-1)_{th}$ capacitor corresponding to the highest bit B(M−1) of the least significant bits [B(M−1), B(M−2), . . . , B1]. A first capacitor C1 corresponding to the lowest bit B1 of the least significant bits [B(M−1), B(M−2), . . . , B1] is the same size as a number 0 capacitor C0 that has a fixed connection as that depicted in FIG. 1. From the first capacitor C2 to the $(M-1)_{th}$ capacitor C(M−1) corresponding to the lowest bit B1 to the highest bit B(M−1) of the least significant bits [B(M−1), B(M−2), . . . , B1], the capacitor size increases by a factor of two. From the $M_{th}$ capacitor CM to the $N_{th}$ capacitor CN corresponding to the lowest bit BM to the highest bit BN of the most significant bits [BN, B(N−1), . . . , BM], the capacitor size increases by a factor of two.

In such a capacitance design, the lower boundary of the normal range is $2^{(M-2)}$, and the upper boundary of the normal range is $2^{(M-1)}+2^{(M-2)}-1$.

In response to an overshoot, exceeding $2^{(M-2)}$, at the LSB code, the comparator error detector 106 checks the most significant bits [BN, B(N−1), . . . , BM]. K is a number greater than M. If the $K_{th}$ bit BK is 0, and the $(K-1)_{th}$ bit to the $M_{th}$ bit [B(K−1), B(K−2), . . . , BM] are all 1s, the comparator error detector 106 determines that the $K_{th}$ most-significant-bit comparator CompHK corresponding to the $K_{th}$ bit (BK, which is 0) is the target comparator with the negative offset.

In an exemplary embodiment, it is determined whether the $(M+1)_{th}$ bit and the $M_{th}$ bit of the digital control bits (i.e. the least significant two bits of [BN, B(N−1), . . . , BM]) is "10" when an overshoot LSB code occurs. If yes, the comparator error detector 106 determines that the $M_{th}$ most-significant-bit comparator CompHM corresponding to the $M_{th}$ bit (BM) of the digital control bits is the target comparator with the negative offset.

In response to a undershoot, lower than $2^{(M-1)}+2^{(M-2)}-1$, at the LSB code, the comparator error detector 106 also checks the most significant bits [BN, B(N−1), . . . , BM]. If the $K_{th}$ bit BK is 1, and the $(K-1)_{th}$ bit to the $M_{th}$ bit [B(K−1), B(K−2), . . . , BM] are all 0s, the comparator error detector 106 determines that the $K_{th}$ most-significant-bit comparator CompHK corresponding to the $K_{th}$ bit (BK, which is 1) is the target comparator with the positive offset.

In an exemplary embodiment, it is determined whether the $(M+1)_{th}$ bit and the $M_{th}$ bit of the digital control bits (i.e. the least significant two bits of [BN, B(N−1), . . . , BM]) is "01" when a undershoot LSB code occurs. If yes, the comparator error detector 106 determines that the $M_{th}$ most-significant-bit comparator CompHM corresponding to the $M_{th}$ bit (BM) of the digital control bits is the target comparator with the positive offset.

In the disclosure, the proposed SAR ADC involves redundancy approximation and uses multiple MSB comparators. Furthermore, a comparator error detector is provided to detect the occurrence of a comparator error based on the least significant bits, and identifies the target comparator that is causing the comparator error based on the most significant bits.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A successive-approximation register analog-to-digital converter with comparator error detection, comprising:

a digital-to-analog converter, a plurality of comparators, and a successive-approximation register logic, configured to form a loop for successive approximation of a digital representation of an analog input; and a comparator error detector, coupled to the loop;

wherein:

digital control bits controlling the digital-to-analog converter include most significant bits and least significant bits, and the digital-to-analog converter is configured to provide redundancy approximation at the lowest bit of the most significant bits;

the comparators include a plurality of most-significant-bit comparators corresponding to the most significant bits; and the comparator error detector detects occurrence of a comparator error based on the least significant bits, and identifies a target comparator causing the comparator error based on the most significant bits.

2. The successive-approximation register analog-to-digital converter as claimed in claim 1, wherein:

the most-significant-bit comparators correspond to the most significant bits in a one-to-one relationship, and generate the most significant bits one by one.

3. The successive-approximation register analog-to-digital converter as claimed in claim 2, wherein:

the comparator error detector is coupled to the successive-approximation register logic to receive the least significant bits, and transforms the least significant bits into a least-significant-bit code that corresponds to a normal range; and when determining that the least-significant-bit code is beyond the normal range, the comparator error detector confirms the occurrence of the comparator error.

4. The successive-approximation register analog-to-digital converter as claimed in claim 3, wherein:

when determining that the least-significant-bit code is greater than an upper boundary of the normal range, the comparator error detector determines that the target comparator introduces a negative offset.

5. The successive-approximation register analog-to-digital converter as claimed in claim 4, wherein:

the lowest bit of the most significant bits is the $M_{th}$ bit of the digital control bits, where M is a number; and K is a number greater than M;

when determining that the $K_{th}$ bit of the digital control bits is 0 and the (K−1)th bit to the $M_{th}$ bit of the digital control bits are all 1s, the comparator error detector determines that a $K_{th}$ most-significant-bit comparator corresponding to the $K_{th}$ bit of the digital control bits is the target comparator with the negative offset; and it is further determined whether the $(M+1)_{th}$ bit and the $M_{th}$ bit of the digital control bits are "10" when an overshoot least-significant-bit code occurs, and, if yes, the comparator error detector determines that the $M_{th}$ most-significant-bit comparator corresponding to the $M_{th}$ bit of the digital control bits is the target comparator with the negative offset.

6. The successive-approximation register analog-to-digital converter as claimed in claim 3, wherein:

when determining that the least-significant-bit code is smaller than a lower boundary of the normal range, the comparator error detector determines that the target comparator introduces a positive offset.

7. The successive-approximation register analog-to-digital converter as claimed in claim 6, wherein:

the lowest bit of the most significant bits is the $M_{th}$ bit of the digital control bits, where M is a number; and K is a number greater than M;

when determining that the $K_{th}$ bit of the digital control bits is 1 and the $(K-1)_{th}$ bit to the $M_{th}$ bit of the digital control bits are all 0s, the comparator error detector determines that a $K_{th}$ most-significant-bit comparator corresponding to the $K_{th}$ bit of the digital control bits is the target comparator with the positive offset; and it is further determined whether the $(M+1)_{th}$ bit and the $M_{th}$ bit of the digital control bits are "01" when an undershoot least-significant-bit code occurs, and, if yes, the comparator error detector determines that the $M_{th}$ most-significant-bit comparator corresponding to the $M_{th}$ bit of the digital control bits is the target comparator with the positive offset.

8. The successive-approximation register analog-to-digital converter as claimed in claim 3, wherein:

the digital-to-analog converter is a capacitor digital-to-analog converter;

M is a number; and in the capacitor digital-to-analog converter, an $M_{th}$ capacitor corresponding to the lowest bit of the most significant bits is the same size as an $(M-1)_{th}$ capacitor corresponding to the highest bit of the least significant bits.

9. The successive-approximation register analog-to-digital converter as claimed in claim 8, wherein, in the capacitor digital-to-analog converter:

a first capacitor corresponding to the lowest bit of the least significant bits is the same size as a number 0 capacitor that has a fixed connection;

from the first capacitor to the $(M-1)_{th}$ capacitor corresponding to the lowest bit of the least significant bits to the highest bit of the least significant bits, the capacitor size increases by a factor of two.

10. The successive-approximation register analog-to-digital converter as claimed in claim 9, wherein:

N is a number; and in the capacitor digital-to-analog converter, from the $M_{th}$ capacitor to the $N_{th}$ capacitor corresponding to the lowest bit of the most significant bits to the highest bit of the most significant bits, the capacitor size increases by a factor of two.

11. The successive-approximation register analog-to-digital converter as claimed in claim 9, wherein:

a lower boundary of the normal range is $2^{(M-2)}$; and an upper boundary of the normal range is $2^{(M-1)}+2^{(M-2)}-1$.

12. The successive-approximation register analog-to-digital converter as claimed in claim 3, wherein:

the comparator error detector determines an offset value of the target comparator based on a difference between the least-significant-bit code and an upper boundary or a lower boundary of the normal range.

13. The successive-approximation register analog-to-digital converter as claimed in claim 12, further comprising:

a compensation logic, coupled to the comparator error detector and the successive-approximation register logic, and configured to adjust the digital representation received from the successive-approximation register logic to compensate for the offset value of the target comparator that is obtained by the comparator error detector.

14. The successive-approximation register analog-to-digital converter as claimed in claim 3, wherein:

each most-significant-bit comparator is reset just one time in one approximation cycle.

15. The successive-approximation register analog-to-digital converter as claimed in claim 3, wherein:

the comparators provide one single least-significant-bit comparator to correspond to all of the least significant bits; and the least-significant-bit comparator is repeatedly reset in one approximation cycle.

* * * * *